US009210820B2

(12) United States Patent
Wong et al.

(10) Patent No.: US 9,210,820 B2
(45) Date of Patent: Dec. 8, 2015

(54) ELECTRONIC DEVICE

(71) Applicants: Chun-Chieh Wong, Taipei (TW); Cheng-Yu Wang, Taipei (TW)

(72) Inventors: Chun-Chieh Wong, Taipei (TW); Cheng-Yu Wang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 320 days.

(21) Appl. No.: 13/714,430

(22) Filed: Dec. 14, 2012

(65) Prior Publication Data

US 2013/0215564 A1 Aug. 22, 2013

Related U.S. Application Data

(60) Provisional application No. 61/601,001, filed on Feb. 20, 2012.

(30) Foreign Application Priority Data

Nov. 26, 2012 (TW) .............................. 101144166 A

(51) Int. Cl.
*H05K 7/20* (2006.01)
*H05K 5/02* (2006.01)
*H01L 23/473* (2006.01)

(52) U.S. Cl.
CPC .......... *H05K 5/0217* (2013.01); *H05K 7/20181* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/46–23/467
USPC ........................ 361/679.46–679.54, 688–723; 361/676–678; 165/80.1–80.5, 185, 104.33; 174/15.1–15.2, 16.1–16.3, 521, 526, 174/547–548; 454/185; 257/712–722, 257/E23.088
See application file for complete search history.

(56) References Cited

U.S. PATENT DOCUMENTS

| 5,460,571 | A | * | 10/1995 | Kato et al. | ..................... 454/184 |
| 5,586,865 | A | * | 12/1996 | Yin | ............................ 415/213.1 |
| 6,297,950 | B1 | * | 10/2001 | Erwin | ...................... 361/679.49 |
| 7,226,352 | B2 | * | 6/2007 | Oh | ................................. 454/184 |
| 7,345,875 | B2 | * | 3/2008 | Elkins | ........................... 361/695 |

(Continued)

FOREIGN PATENT DOCUMENTS

| TW | 562396 | 11/2003 |
| TW | M288712 | 3/2006 |
| TW | M302858 | 12/2006 |

*Primary Examiner* — Anthony Haughton
*Assistant Examiner* — Razmeen Gafur
(74) *Attorney, Agent, or Firm* — Jianq Chyun IP Office

(57) ABSTRACT

An electronic device includes an accommodating space, a fan, a cover, and a three dimensional dust extraction mesh. The fan is disposed in the accommodating space. The fan includes a first fixing portion. The cover detachably covers the accommodating space, and the cover includes a second fixing portion in accommodating space. The three dimensional dust extraction mesh includes a body, a third fixing portion, and a fourth fixing portion, and the third fixing portion and the fourth fixing portion are located at periphery of the body. The third fixing portion of the three dimensional dust extraction mesh cooperates with the first fixing portion of the fan, and the fourth fixing portion of the three dimensional dust extraction mesh cooperates with the second fixing portion of the cover to detachably fix the three dimensional dust extraction mesh between the cover and the fan.

4 Claims, 5 Drawing Sheets

(56) References Cited

U.S. PATENT DOCUMENTS

| | | | |
|---|---|---|---|
| 7,385,813 B2* | 6/2008 | Lin | 361/695 |
| 7,466,545 B2* | 12/2008 | Hung | 361/679.48 |
| 7,499,275 B2* | 3/2009 | Lai et al. | 361/695 |
| 7,537,517 B1* | 5/2009 | Meserth et al. | 454/184 |
| 7,983,039 B1* | 7/2011 | Nguyen et al. | 361/695 |
| 7,995,341 B2* | 8/2011 | Wu et al. | 361/695 |
| 8,821,129 B2* | 9/2014 | Heli et al. | 416/247 R |
| 2003/0026074 A1* | 2/2003 | Clements et al. | 361/695 |
| 2006/0116065 A1* | 6/2006 | Ishii | 454/184 |
| 2006/0196643 A1* | 9/2006 | Hata et al. | 165/104.33 |
| 2006/0292975 A1* | 12/2006 | Lin et al. | 454/184 |
| 2007/0195499 A1* | 8/2007 | Chu | 361/695 |
| 2007/0284091 A1* | 12/2007 | Ghosh et al. | 165/104.33 |
| 2008/0043432 A1* | 2/2008 | Hung | 361/695 |
| 2008/0045135 A1* | 2/2008 | Pfannenberg | 454/184 |
| 2008/0124234 A1* | 5/2008 | Echazarreta | 417/423.14 |
| 2008/0160898 A1* | 7/2008 | Pfannenberg | 454/184 |
| 2008/0170940 A1* | 7/2008 | Wu et al. | 415/214.1 |
| 2009/0175002 A1* | 7/2009 | Tseng et al. | 361/694 |
| 2010/0246124 A1* | 9/2010 | Strong | 361/695 |
| 2010/0284149 A1* | 11/2010 | Su | 361/695 |
| 2011/0063799 A1* | 3/2011 | Takahasi et al. | 361/695 |
| 2011/0150632 A1* | 6/2011 | Heli et al. | 415/121.2 |
| 2011/0234065 A1* | 9/2011 | Chang | 312/237 |
| 2012/0031272 A1* | 2/2012 | Rubit et al. | 95/287 |

* cited by examiner

ELECTRONIC DEVICE

CROSS-REFERENCE TO RELATED APPLICATION

This application claims the priority benefits of U.S. provisional application Ser. No. 61/601,001, filed on Feb. 20, 2012 and Taiwan application serial no. 101144166, filed on Nov. 26, 2012. The entirety of each of the above-mentioned patent applications is hereby incorporated by reference herein and made a part of this specification.

BACKGROUND OF THE INVENTION

1. Field of the Invention

The disclosure relates to an electronic device and, more particularly, relates to an electronic device with a three dimensional dust extraction mesh.

2. Description of the Related Art

After dirt accumulates at a notebook for a period of time, the heat dispassion performance of the system may be affected, and thus the temperature and the noise of the system may be high, and the life of system components and a heat dispassion module are also affected. Dirt accumulated in the system includes dust and fiber, when the dirt is blown out from the inlet or an opening of an input output unit of the fan, some dirt is blown out of fan from an air outlet, and some dirt remains attaching to a mainboard, fan blades, and fins.

Since the fin is a stack structure with small clearance between adjacent fins, the space for air passing through is limited, and dust and fiber are easily accumulated at the fins. Consequently, flow resistance of the fan (fan impedance) increases after a long time use, and air flow is decreased, and then heat dissipation efficiency is decreased.

Notebooks usually have three conventional anti-dust and dust extraction methods.

FIG. 1A is a schematic diagram showing a conventional dust extraction unit. A dust extraction unit 10 is disposed between the fan 12 and the fin 14. However, a space for disposing the dust extraction unit 10 should be added, and it may affect the configuration of fan 12 or the fin 14.

FIG. 1B is a schematic diagram showing another conventional dust extraction unit. A dust extraction unit 22 (such as a net structure or non-woven) is disposed at an inlet 20 of the system. However, the resistance of the inlet 20 of the system is increased, and supply air volume is decreased, and the heat dissipation performance is affected.

FIG. 1C is a schematic diagram showing further another conventional dust extraction unit. A fixing structure 34 disposed at a side of the fan 30 is connected with the dust extraction mesh 32 to fix the dust extraction mesh 32 at the fan 30. However, since only the dust extraction mesh 32 is fixed to the fan 30, the dust extraction mesh 32 easily drops when the system is shaken. Furthermore, since the fixing structure 34 is located at the side of the fan 30, the system space is reduced.

BRIEF SUMMARY OF THE INVENTION

An electronic device includes an accommodating space, a fan, a cover, and a three dimensional dust extraction mesh. The fan is disposed in the accommodating space. The fan includes a first fixing portion. The cover detachably covers the accommodating space, and the cover includes a second fixing portion in accommodating space. The three dimensional dust extraction mesh includes a body, a third fixing portion, and a fourth fixing portion, and the third fixing portion and the fourth fixing portion are located at periphery of the body. The third fixing portion of the three dimensional dust extraction mesh cooperates with the first fixing portion of the fan, and the fourth fixing portion of the three dimensional dust extraction mesh cooperates with the second fixing portion of the cover to detachably fix the three dimensional dust extraction mesh between the cover and the fan.

In an embodiment, the first fixing portion and the third fixing portion, and the second fixing portion and the fourth fixing portion are fixed in a fastening, magnetic, abutting, or locking mode, respectively.

In sum up, the first fixing portion is disposed at the air inlet side of the fan of the electronic device, which has less effect on the space, to fix the third fixing portion of the three dimensional dust extraction mesh. Moreover, the fourth fixing portion of the three dimensional dust extraction mesh is fixed via the second fixing portion of the cover to hold the three dimensional dust extraction mesh between the fan and the cover to prevent the three dimensional dust extraction mesh from falling off due to the shake of the system.

Additionally, the three-dimensional shape of the body (such as dome) can block more dirt and make the distance between dirt and the fan farther to reduce noise. To disassemble the three dimensional dust extraction mesh, the user only needs to remove the cover, the three dimensional dust extraction mesh can be disassembled from the fan easily.

These and other features, aspects and advantages of the present invention will become better understood with regard to the following description, appended claims, and accompanying drawings.

DETAILED DESCRIPTION OF THE EMBODIMENTS

Figure 2A:
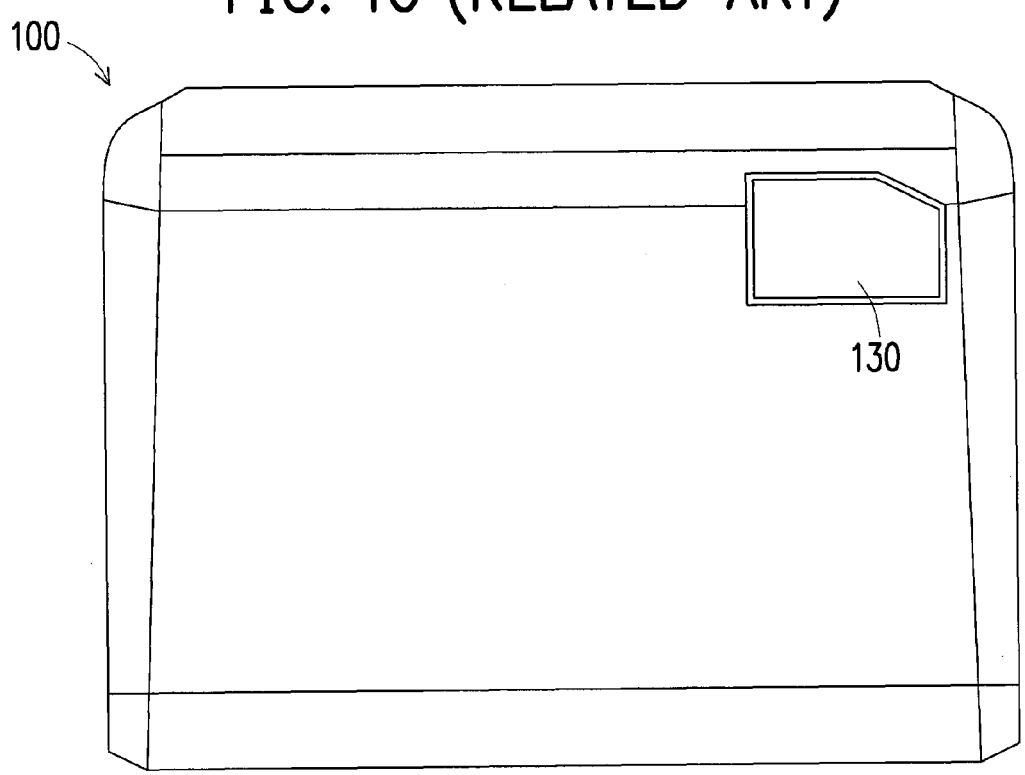
FIG. 2A is a schematic diagram showing an electronic device in a first embodiment of the disclosure.
Figure 2B:
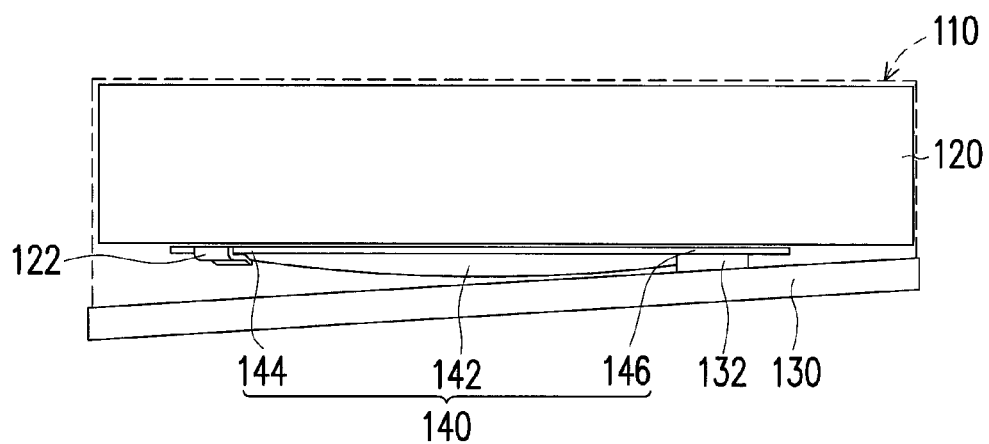
FIG. 2B is a schematic diagram showing part of inner of the electronic device in FIG. 2A.

FIG. 2A is a schematic diagram showing an electronic device in a first embodiment of the disclosure. FIG. 2B is a schematic diagram showing part of inner of the electronic device in FIG. 2A. In an embodiment, an electronic device 100 includes an accommodating space 110, a fan 120, a cover 130, and a three dimensional dust extraction mesh 140.

In the embodiment, the electronic device 100 is a notebook, which is not limited herein.

As shown in FIG. 2B, the fan 120 is disposed at the accommodating space 110 of the electronic device 100. The fan 120 includes a first fixing portion 122. The cover 130 detachably convers the accommodating space 110. The cover 130 includes a second fixing portion 132 in the accommodating space 110.

The three dimensional dust extraction mesh 140 includes a body 142, a third fixing portion 144 and a fourth fixing portion 146 which are located at the periphery of the body 142. The third fixing portion 144 of the three dimensional dust extraction mesh 140 cooperates with the first fixing portion 122 of the fan 120, and the fourth fixing portion 146 of the three dimensional dust extraction mesh 140 cooperates with the second fixing portion 132 of the cover 130 to detachably fix the three dimensional dust extraction mesh 140 between the cover 130 and the fan 120.

Figure 2C:
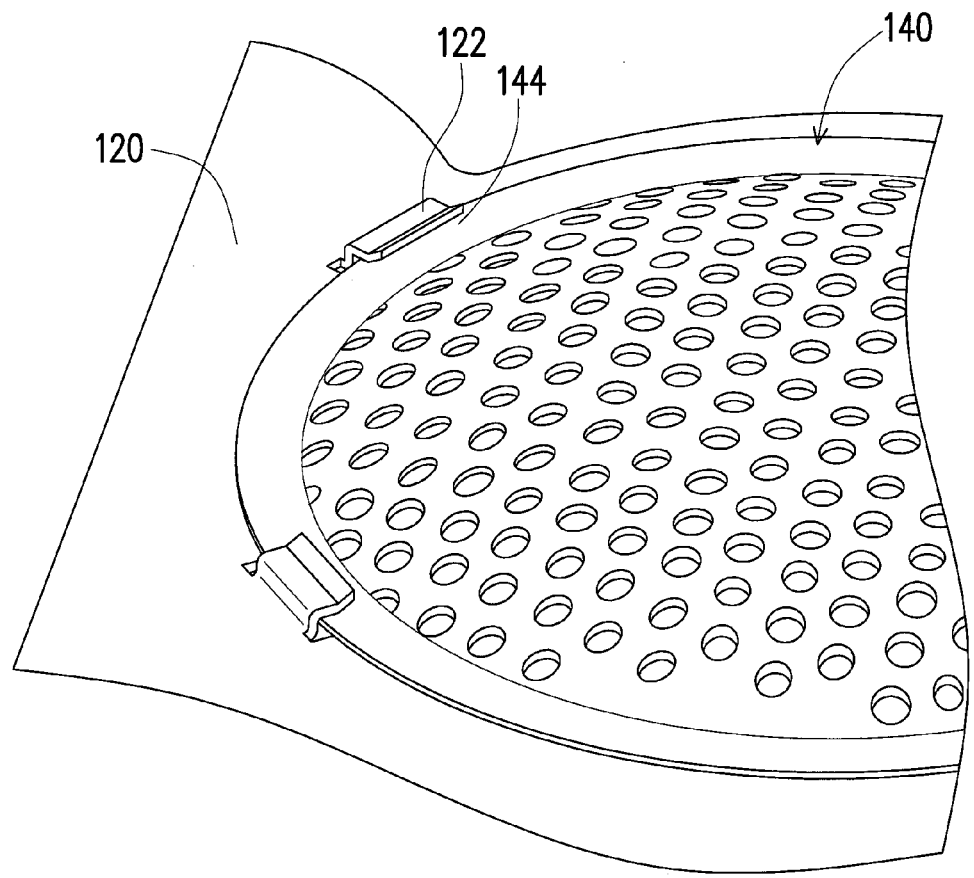
FIG. 2C is a schematic diagram showing the three dimensional dust extraction mesh of the electronic device in FIG. 2A is fixed to the fan.

FIG. 2C is a schematic diagram showing the three dimensional dust extraction mesh of the electronic device in FIG. 2A is fixed to the fan. In the embodiment, the first fixing portion 122 is located at an air inlet side of the fan 120, such as a fan cover or a fan pillow of the fan 120.

In contrast with that the fixing structure 34 conventionally disposed at a side of the fan 30, the first fixing portion 122 at the air inlet side of the fan 120 in the embodiment have less effect on the space of the electronic device 100. In the embodiment, the first fixing portion 122 is formed at the air inlet side of the fan 120 in a metal stamping method, which is not limited herein. As shown in FIG. 2C, the third fixing portion 144 of the three dimensional dust extraction mesh 140 is fastened to the first fixing portion 122 of the fan 120.

Figure 2D:
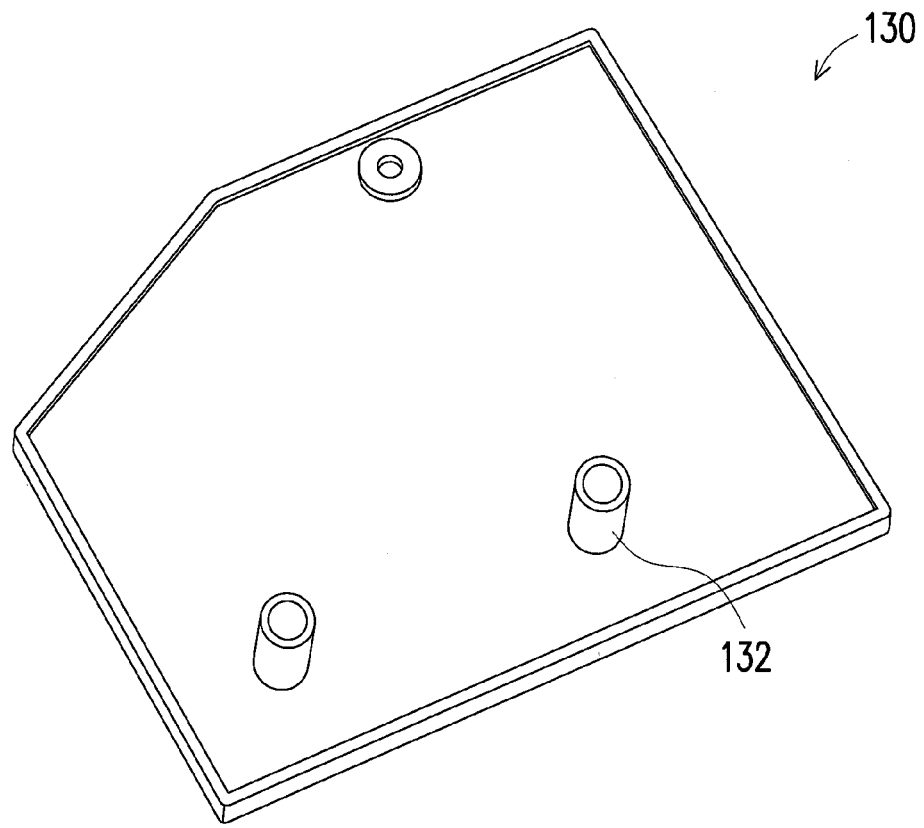
FIG. 2D is a schematic diagram showing a cover and a second fixing portion of the electronic device in FIG. 2A.

FIG. 2D is a schematic diagram showing a cover and a second fixing portion of the electronic device in FIG. 2A. In the embodiment, the second fixing portion 132 of the cover 130 is a pillar which may be formed via the plastic injection method. When the cover 130 covers on the accommodating space 110, the second fixing portion 132 of the cover 130 is against the fourth fixing portion 146 of the three dimensional dust extraction mesh 140 to fix the three dimensional dust extraction mesh 140 at the fan 120. In other words, the three dimensional dust extraction mesh 140 is sandwiched between the fan 120 and the cover 130.

In the embodiment, the three dimensional dust extraction mesh 140 is fixed to the first fixing portion 122 of the fan 120 via the third fixing portion 144, and the second fixing portion 132 of the cover 130 is against the fourth fixing portion 146 of the three dimensional dust extraction mesh 140 to foam a dual-fixing structure.

Figure 1A:
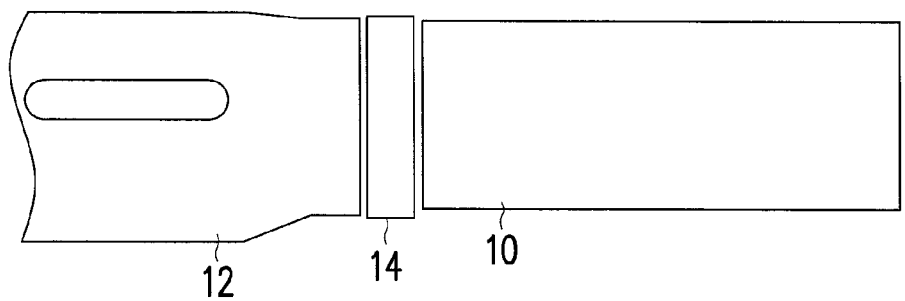
FIG. 1A is a schematic diagram showing a conventional dust extraction unit.
Figure 1B:
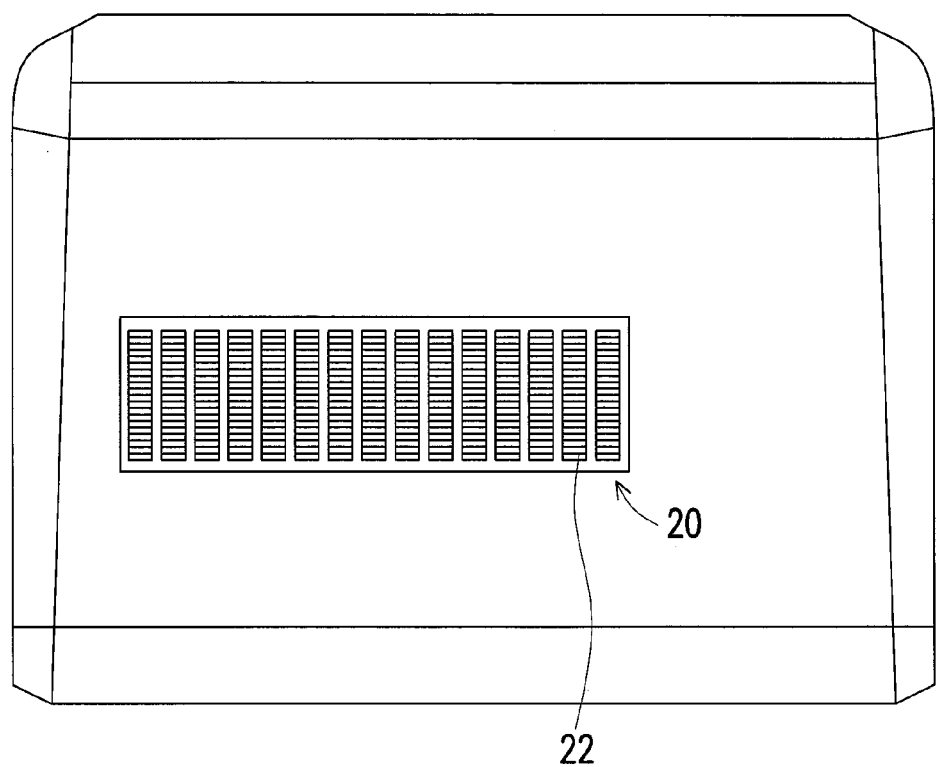
FIG. 1B is a schematic diagram showing another conventional dust extraction unit.
Figure 1C:
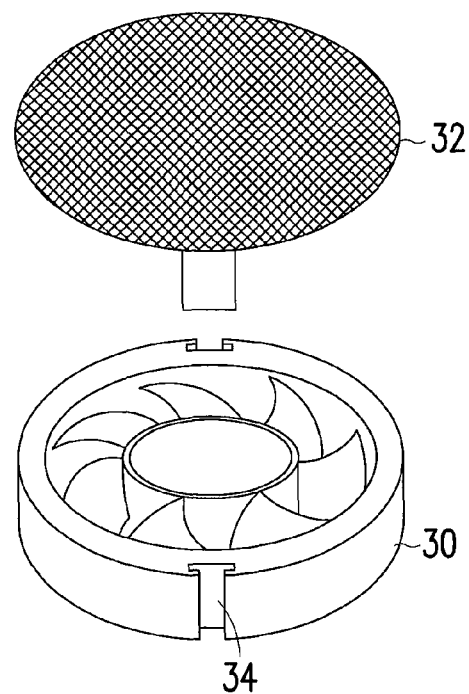
FIG. 1C is a schematic diagram showing further another conventional dust extraction unit.

As shown in FIG. 1C, to clean dirt, it should disassemble the system, and then detach the dust extraction mesh 32 from the fixing structure 34 of the fan 30 via some methods or tools. In the embodiment of the disclosure, although the three dimensional dust extraction mesh 140 includes a dual fixing structure, to remove the three dimensional dust extraction mesh 140, the user only needs to disassemble the cover 130, and pull the three dimensional dust extraction mesh 140 out from the first fixing portion 122 of the fan 120. The three dimensional dust extraction mesh 140 can be disassembled easily without any specific methods or tools, and the fan can be cleaned easily and quickly.

The fixing modes between the first fixing portion 122 and the third fixing portion 144, and between the second fixing portion 132 and the fourth fixing portion 146 may be magnet, fastening, or locking, which is not limited herein.

In the embodiment, the third fixing portion 144 and the fourth fixing portion 146 are disposed at the symmetric position of the periphery of the body 142 to hold the three dimensional dust extraction mesh 140 symmetrically. The positions of third fixing portion 144 and the fourth fixing portion 146 at the body 142 are not limited herein.

In the embodiment, the mesh structure with aperture ratio higher than 20% is used as a dustproof structure for the body 142 of the three dimensional dust extraction mesh 140, and apertures may be circle, square, hexagonal holes or irregular shape holes, which is not limited herein. The material of the body 142 of the three dimensional dust extraction mesh 140 may be metal or mylar, the material of the body 142 of the three dimensional dust extraction mesh 140 is not limited herein.

Figure 2E:
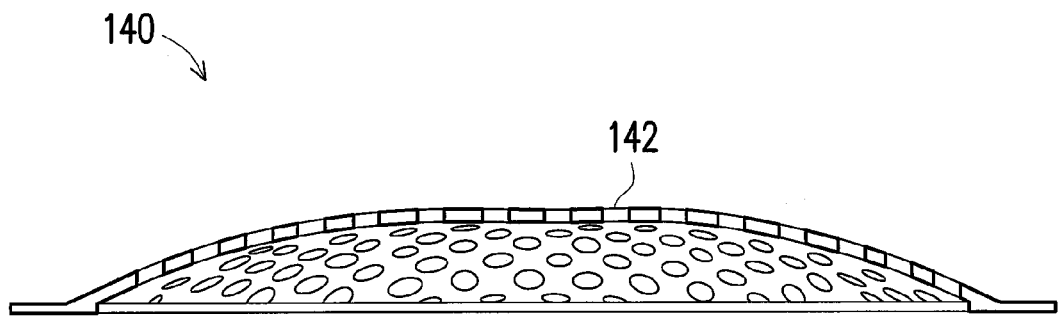
FIG. 2E is a schematic diagram showing a side view of the electronic device in FIG. 2A.

FIG. 2E is a schematic diagram showing a side view of the electronic device in FIG. 2A. In the embodiment, the shape of the body 142 is dome, and it can increase the area to block dirt and extend the life of the three dimensional dust extraction mesh 140. The shape of the body 142 also may be polyhedron or cylinder, which is not limited herein. Moreover, when dirt accumulates at the three dimensional dust extraction mesh 140, since a space is between dirt and blades s of the fan 120, the noise of the fan due to accumulated dirt can be reduced.

Figure 3:
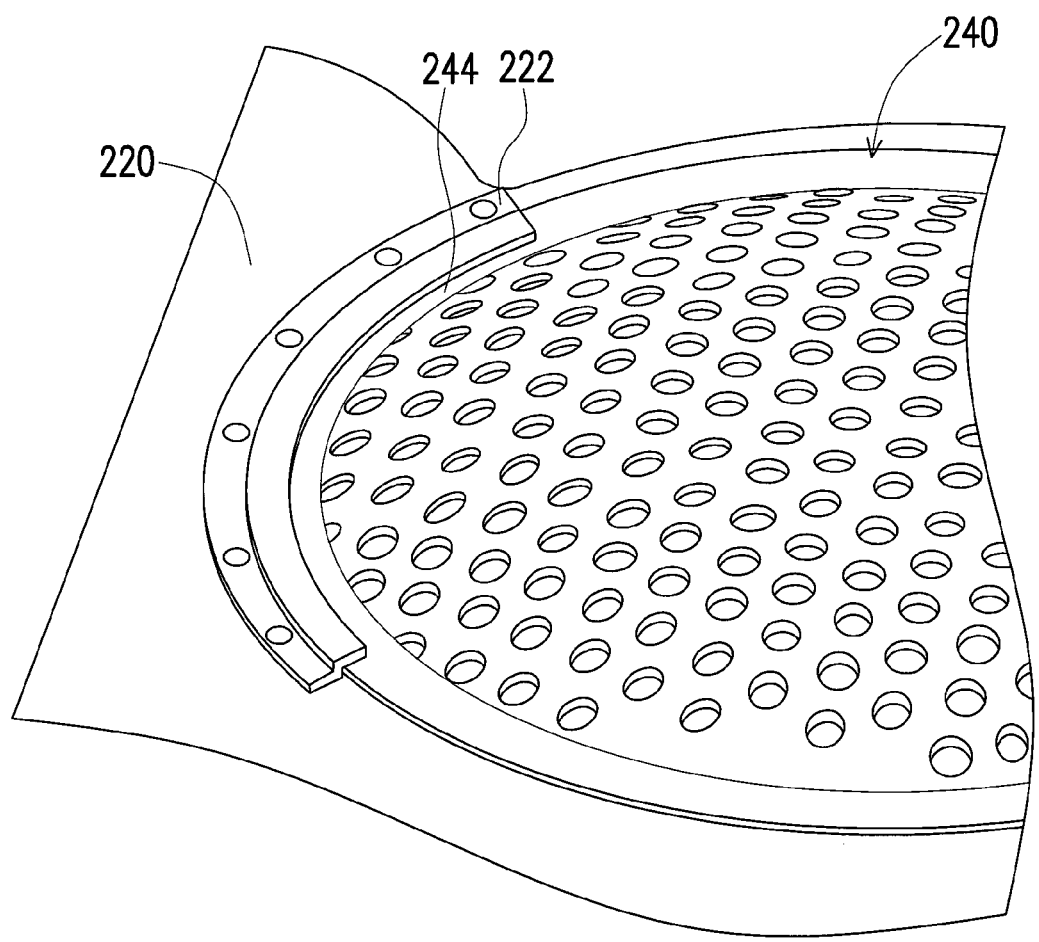
FIG. 3 is a schematic diagram showing the first fixing portion of the electronic device in another embodiment of the disclosure.

FIG. 3 is a schematic diagram showing the first fixing portion of the electronic device in another embodiment of the disclosure. The main difference between the first fixing portion 222 in FIG. 3 and the first fixing portion 122 in FIG. 2C is that the first fixing portion 222 in FIG. 3 is disposed the air inlet side of the fan 220 in a riveting mode. The first fixing portion 222 also may be disposed the air inlet side of the fan 220 in a plastic injection mode, which is not limited herein. In the embodiment, the first fixing portion 222 includes a fastening slot for holding the third fixing portion 244 of the three dimensional dust extraction mesh 240. The fixing modes between the third fixing portion 244 of the three dimensional dust extraction mesh 240 and the first fixing portion 222 of the fan 220, which is not limited herein.

In sum up, the first fixing portion is disposed at the air inlet side of the fan of the electronic device to fix the third fixing portion of the three dimensional dust extraction mesh, which has less effect on the space. Moreover, the fourth fixing portion of the three dimensional dust extraction mesh is fixed via the second fixing portion of the cover to hold the three dimensional dust extraction mesh between the fan and the cover to prevent the three dimensional dust extraction mesh from falling off due to the shake of the system. Additionally, three-dimensional shape of the body (such as dome) can block more dirt and make the distance between dirt and the fan farther to reduce noise. To disassemble the three dimensional dust extraction mesh, the user only needs to remove the cover, the three dimensional dust extraction mesh can be disassembled from the fan easily.

Although the present invention has been described in considerable detail with reference to certain preferred embodiments thereof, the disclosure is not for limiting the scope. Persons having ordinary skill in the art may make various modifications and changes without departing from the scope. Therefore, the scope of the appended claims should not be limited to the description of the preferred embodiments described above.

What is claimed is:
1. An electronic device, comprising:
an accommodating space;
a fan disposed in the accommodating space, wherein the fan includes a first fixing portion;
a cover detachably covering the accommodating space, wherein the cover includes a second fixing portion in accommodating space; and
a three dimensional dust extraction mesh including a body, a third fixing portion, and a fourth fixing portion, wherein the shape of the body is dome, and the third fixing portion and the fourth fixing portion are located at periphery of the body;

wherein the third fixing portion of the three dimensional dust extraction mesh cooperates with the first fixing portion of the fan, and the fourth fixing portion of the three dimensional dust extraction mesh cooperates with the second fixing portion of the cover to detachably fix the three dimensional dust extraction mesh between the cover and the fan.

2. The electronic device according to claim 1, wherein fixing modes between the first fixing portion and the third fixing portion, and between the second fixing portion and the fourth fixing portion are fastening, magnetic, abutting, or locking.

3. The electronic device according to claim 1, wherein the first fixing portion is at an air inlet side of the fan.

4. The electronic device according to claim 1, wherein the third fixing portion and the fourth fixing portion are located at symmetric position of the periphery of the body.

* * * * *